United States Patent
Bhattacharyya et al.

(10) Patent No.: US 9,752,877 B2
(45) Date of Patent: Sep. 5, 2017

(54) ELECTRONIC DEVICE HAVING ELECTRONIC COMPASS WITH DEMAGNETIZING COIL AND ANNULAR FLUX CONCENTRATING YOKES

(71) Applicant: Apple Inc., Cupertino, CA (US)

(72) Inventors: Manoj K Bhattacharyya, Cupertino, CA (US); Christopher E. Balcells, San Jose, CA (US); Jian Guo, Milpitas, CA (US); Peter G. Hartwell, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 194 days.

(21) Appl. No.: 14/838,075

(22) Filed: Aug. 27, 2015

(65) Prior Publication Data

US 2016/0313122 A1    Oct. 27, 2016

Related U.S. Application Data

(60) Provisional application No. 62/151,628, filed on Apr. 23, 2015.

(51) Int. Cl.
*G01C 17/02* (2006.01)
*G01R 33/09* (2006.01)
*G01R 33/00* (2006.01)
*G01R 35/00* (2006.01)

(52) U.S. Cl.
CPC ........ *G01C 17/02* (2013.01); *G01R 33/0011* (2013.01); *G01R 33/093* (2013.01); *G01R 35/005* (2013.01)

(58) Field of Classification Search
CPC .. G01C 17/02; G01R 33/0011; G01R 33/093; G01R 35/005

USPC .......................................................... 33/361
See application file for complete search history.

(56) References Cited

U.S. PATENT DOCUMENTS

| | | | |
|---|---|---|---|
| 5,499,143 A * | 3/1996 | Sakamoto | G02B 7/08 310/13 |
| 5,774,415 A * | 6/1998 | Hall | G01V 13/00 367/13 |
| 8,115,479 B2 | 2/2012 | Aimuta et al. | |
| 8,421,453 B2 | 4/2013 | Bauer | |
| 8,564,283 B2 | 10/2013 | Mita et al. | |
| 2011/0133728 A1 | 6/2011 | Tokunaga | |
| 2013/0265039 A1 | 10/2013 | Cai et al. | |
| 2016/0306015 A1* | 10/2016 | Yang | G01R 33/093 |
| 2016/0313122 A1* | 10/2016 | Bhattacharyya | G01C 17/02 |

* cited by examiner

*Primary Examiner* — Yaritza Guadalupe-McCall
(74) *Attorney, Agent, or Firm* — Treyz Law Group, P.C.; G. Victor Treyz

(57) ABSTRACT

An electronic device may be provided with an electronic compass. The electronic compass may include magnetic sensors. The magnetic sensors may include thin-film magnetic sensor elements such as giant magnetoresistance sensor elements. Magnetic flux concentrators may be used to guide magnetic fields through the sensor elements. To reduce offset in the electronic compass, the magnetic flux concentrators may be demagnetized by applying a current to a coil in the housing. The coil may be formed from loops of metal traces within a printed circuit or other loops of conductive paths. Magnetic flux concentrators may have ring shapes. A ring-shaped magnetic flux concentrator may be formed from multiple thin stacked layers of soft magnetic material separated by non-magnetic material.

26 Claims, 17 Drawing Sheets

ELECTRONIC DEVICE HAVING ELECTRONIC COMPASS WITH DEMAGNETIZING COIL AND ANNULAR FLUX CONCENTRATING YOKES

This application claims the benefit of and claims priority to provisional patent application No. 62/151,628 filed on Apr. 23, 2015, which is incorporated by reference herein in its entirety.

BACKGROUND

This relates generally to electronic devices, and, more particularly, to electronic devices with electronic compasses.

Electronic devices such as cellular telephones may contain electronic compasses. An electronic compass includes magnetic sensors that detect the Earth's magnetic field. Compass readings may be used to provide orientation information to a navigation application or to other programs that use magnetic sensor data.

The magnetic sensors in electronic compasses may be formed from thin-film sensor structures. Magnetic flux concentrators are used to guide and amplify ambient magnetic fields, thereby enhancing the ability of thin-film sensors to detect weak fields such as the Earth's magnetic field. The magnetic flux concentrators are formed from soft magnetic materials.

Magnetic structures in a magnetic sensor such as the magnetic materials in a magnetic flux concentrator can become magnetized upon exposure to magnetic fields. For example, a magnetic flux concentrator may become magnetized when an external magnet or other source of a large external magnetic field is brought into the vicinity of the magnetic flux concentrator. The magnetization of a flux concentrator that has been exposed to magnetic fields in this way will relax to a remnant state upon removal of the external magnetic field. A remnant state will typically be characterized by a complex pattern of magnetic domains. This pattern of magnetic domains can give rise to a leakage flux that creates an undesired offset in the electronic compass. The offset can introduce inaccuracies in magnetic field readings and can limit the dynamic range of the electronic compass.

It would therefore be desirable to be able to provide improved magnetic compasses.

SUMMARY

An electronic device may be provided with an electronic compass. The electronic device may have a housing in which the electronic compass and control circuitry for operating the electronic compass are mounted. A display may be mounted to the housing.

The electronic compass may include magnetic sensors. The magnetic sensors may include thin-film magnetic sensor elements such as giant magnetoresistance sensor elements. Magnetic flux concentrators may be used to guide magnetic fields through the sensor elements.

To reduce offset in the electronic compass, the magnetic flux concentrators may be demagnetized by applying a current to a coil in the housing. The coil may be formed from loops of metal traces on a printed circuit or other loops of conductive lines. The electronic compass may be mounted on the same printed circuit as the demagnetizing coil or on a different printed circuit. When mounted on the same printed circuit as a coil formed from loops of metal traces, the electronic compass may be mounted inside or outside of the loops or may overlap the loops.

Magnetic flux concentrators may have ring shapes. A ring-shaped magnetic flux concentrator may be formed from multiple thin stacked layers of soft magnetic material separated by non-magnetic material.

DETAILED DESCRIPTION

Figure 1:
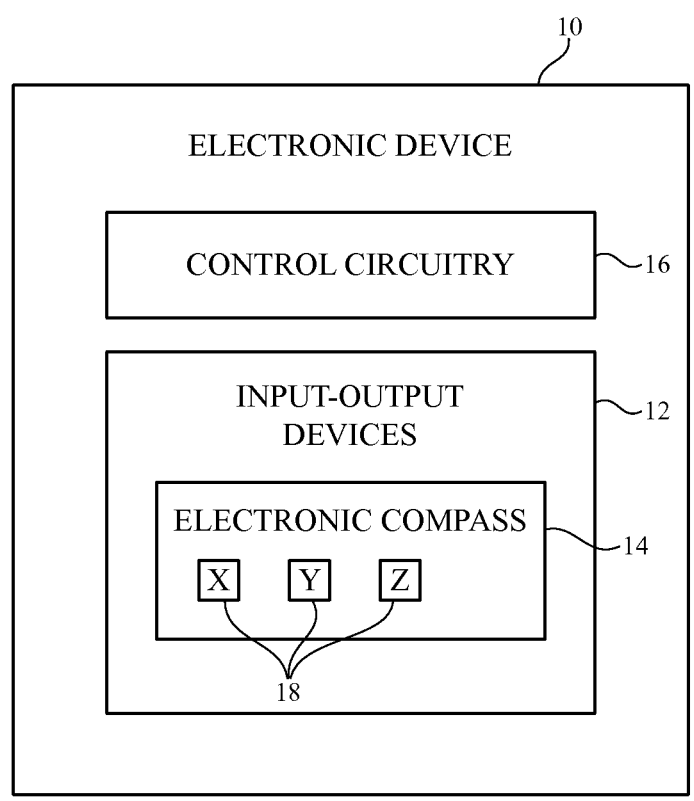
FIG. 1 is a schematic diagram of an illustrative electronic device having a magnetic sensor such as an electronic compass in accordance with an embodiment.

An illustrative electronic device of the type that may be provided with magnetic sensor circuitry such as an electronic compass is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, displays, etc. A user can control the operation of device 10 by supplying commands through input-output devices 12 and may receive status information and other output from device 10 using the output resources of input-output devices 12.

Control circuitry 16 may be used to run software on device 10 such as operating system code and applications. During operation of device 10, the software running on control circuitry 16 may control device 10 using information from sensors and other input-output devices.

Device 10 may be a tablet computer, laptop computer, a desktop computer, a display, a cellular telephone or other portable device, a media player, a wristwatch device or other wearable electronic equipment, part of an embedded system that includes a display and/or other components, or other suitable electronic device.

Input-output devices 12 may include one or more magnetic sensors. The magnetic sensors may be used to measure the Earth's magnetic field or other magnetic fields. With one suitable arrangement, which is sometimes described herein as an example, devices 12 include an electronic compass such as electronic compass 14 for measuring the Earth's magnetic field (and, if desired, other external magnetic fields). Electronic compass 14 may be, for example, a three-axis magnetic sensor having magnetic sensors 18 for three orthogonal directions (e.g., X-axis and Y-axis magnetic sensors for making magnetic field measurements along lateral X and Y dimensions and a Z-axis magnetic sensor for making magnetic field measurements along vertical dimension Z).

Magnetic sensors 18 may include thin-film magnetic sensor elements such as thin-film magnetoresistance sensor elements. Thin-film magnetoresistance sensor elements may be based on anisotropic magnetoresistance (AMR) effects, may be based on giant magnetoresistance (GMR) effects, or may be based on tunneling magnetoresistance (TMR) effects. Other types of sensors 18 may be used, if desired. Configurations in which the magnetic sensor elements for compass 14 are based on giant magnetoresistance effects are sometimes described herein as an example. This is, however, merely illustrative. Compass 14 may sense magnetic fields using any suitable type of magnetic sensor.

Figure 2:
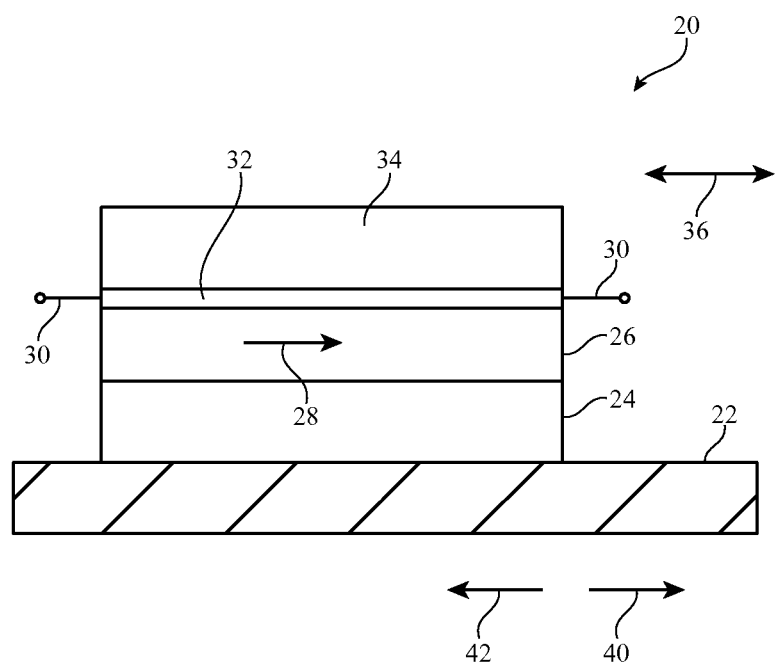
FIG. 2 is a cross-sectional side view of an illustrative thin-film magnetic sensor element in accordance with an embodiment.

A cross-sectional side view of an illustrative giant magnetoresistance magnetic sensor element is shown in FIG. 2. As shown in FIG. 2, thin-film magnetic sensor element 20 (e.g., a giant magnetoresistance sensor element) may include a stack of thin-film structures formed on substrate 22. Pinning layer 24 may be formed from a material such as FeMn, CrMn, or PtMn. Pinned layer 26 may be formed from a magnetic material such as NiFe or NiCo. Magnetic field 28 in pinned layer 26 has a fixed orientation that is established by pinning layer 24. Magnetic layer 34 may be formed on top of layer 26. A non-magnetic layer 32 such as a layer of Cu or Al—Cu may be formed between layers 34 and 26. The resistance of layer 32 may be monitored at terminals 30. Magnetic layer 34 is a free layer (sometimes referred to as a sense layer) having a magnetic field that reflects the state of external magnetic field 36. When, for example, magnetic field 36 is oriented in direction 40, the magnetic field in layer 34 will be oriented in direction 40 and will be parallel to magnetic field 28. In this situation, the electrical resistance in layer 32 will have a first value. When external magnetic field 36 is oriented in direction 42, the magnetic field in layer 34 will be oriented in direction 42 and will be antiparallel to magnetic field 28. When the magnetic fields in layers 34 and 26 are antiparallel, the electrical resistance in layer 32 will have a second value that is greater than the first value. Changes in resistance in layer 32 may therefore be used to measure external magnetic field 36. If desired, other configurations may be used for thin-film magnetic sensor elements in sensors 18. The illustrative configuration of FIG. 2 is presented as an example.

Magnetic sensor elements such as thin-film giant magnetoresistance magnetic sensor element 20 of FIG. 2 may exhibit desirable attributes such as low power consumption. Magnetic flux concentrators that are formed from soft magnetic materials may be used to amplify ambient magnetic fields and to direct ambient magnetic fields through the thin-film sensor elements. The shape of the flux concentrators (which may sometimes be referred to a flux guides, flux directing structures, magnetic flux concentrating yokes, etc.) may be different for the different axes in compass 14. Thin-film magnetic sensors that lie in the horizontal (X-Y) plane may use flux concentrators that redirect fields within the X-Y plane. Magnetic field measurements that are made on vertically oriented magnetic fields (i.e., magnetic fields running along vertical axis Z) may be made using a flux concentrator of the type shown in FIG. 3.

Figure 3:
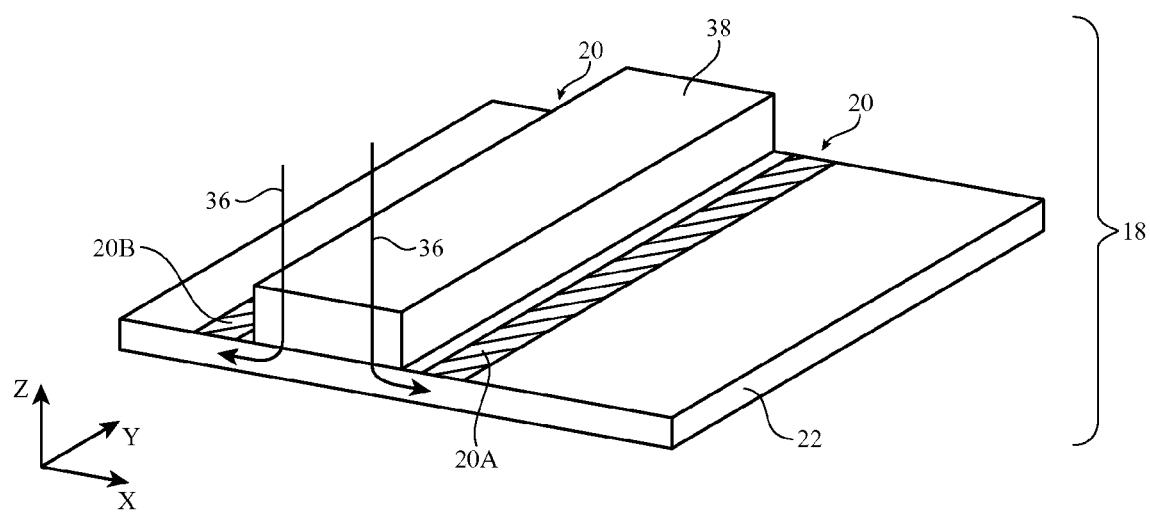
FIG. 3 is a perspective view of an illustrative Z-axis magnetic sensor in accordance with an embodiment.

As shown in FIG. 3, magnetic sensor 18 may include sensor elements 20 and magnetic flux concentrator 38. Magnetic flux concentrator 38 may redirect vertical magnetic fields 36 so that they pass horizontally through sensor elements 20 (i.e., parallel to dimension X in the example of FIG. 3). Flux concentrator 38 may have an elongated rectangular box shape or other suitable shape. The length of flux concentrator 38 along axis Y may, for example, be tens or hundreds of microns or other suitable length. The width of flux concentrator 38 along axis Z may be 1-10 microns or other suitable width. The height of flux concentrator 38 along dimension Z may be 1-20 microns or other suitable height.

Magnetic sensor elements 20 may include first and second elongated thin-film magnetic sensor elements 20A and 20B. When oriented as shown in FIG. 3, sensor element 20A may register an increase in resistance whenever sensor element 20B registers a decrease in resistance. Sensor elements 20A and 20B may therefore sometimes be referred to as positive and negative sensor elements and may be placed in respective positive and negative arms of a resistive bridge circuit or other circuit to facilitate resistance measurements.

Figure 4:
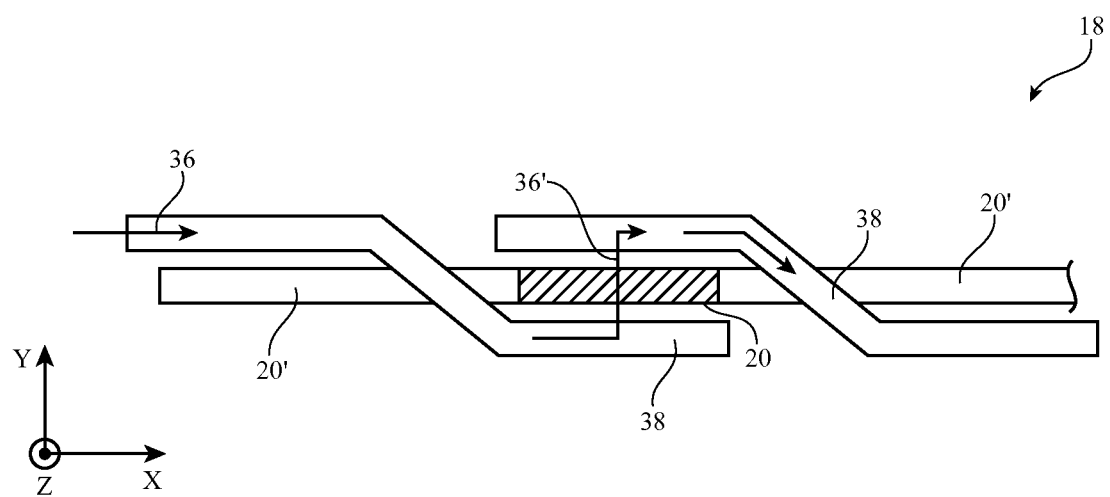
FIG. 4 is a top view of an illustrative X-axis or Y-axis magnetic sensor in accordance with an embodiment.

A top view of an illustrative flux concentrator of the type that may be used to direct and amplify magnetic field 36 when making magnetic field measurements on magnetic field 36 that is in the X-Y plane is shown in FIG. 4. In the example of FIG. 4, sensor 18 is an X-axis magnetic sensor. Incoming magnetic field 36 along axis X is directed through active region 20 of a strip of thin-film magnetoresistance sensor structures (strip 20') by magnetic flux concentrators 38 (see, e.g., magnetic field 36', which is measured by active region 20). Flux concentrators 38 may have a Z-shape or other suitable shape.

If desired, other flux concentrator designs may be used for forming the flux concentrator structures in sensors 18 of compass 14. The configurations shown FIGS. 3 and 4 are merely illustrative.

Figure 5:
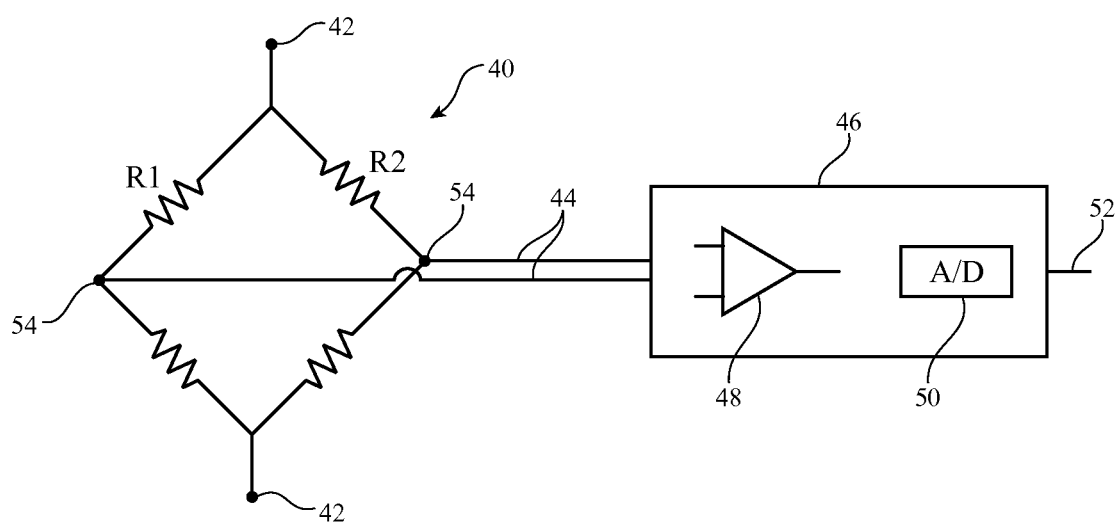
FIG. 5 is a schematic diagram of illustrative circuitry for measuring the resistance of magnetic sensor elements in accordance with an embodiment.

FIG. 5 is an illustrative resistive bridge circuit (i.e., a Wheatstone bridge) of the type that may be used to measure the resistance(s) of one or more magnetic sensor elements 20. In the example of FIG. 5, resistance R1 corresponds to a first magnetic sensor element (e.g., positive element 20A of FIG. 3) and resistance R2 corresponds to a second magnetic sensor element (e.g., negative element 20B of FIG. 3). Reference voltages are applied to terminals 42 of bridge circuit 40. Paths 44 may be used to convey signals from nodes 54 to measurement circuit 46 (e.g., part of control circuitry 16 of FIG. 1). Circuit 46 may contain components such as differential amplifier 48 for producing an output that is proportional to the voltage difference across nodes 54. Analog-to-digital converter 50 may convert this output to a digital output on path 52. The output on path 52 will be proportional to the resistance of sensor elements 20 and will therefore reflect the strength of external magnetic field 36 that is being measured by the magnetic sensor elements in the bridge circuit.

When external magnetic fields of sufficient strength are applied to compass 14, the soft magnetic material of the flux concentrators can become magnetized. Once the external magnetic field(s) is (are) removed, the flux concentrator returns to a "remnant" state. In the remnant state, the patterns of magnetic domains that are established in magnetized flux concentrators can lead to offsets in the readings of magnetic sensors 18 and therefore compass 14. With one suitable arrangement, device 10 may include one or more coils that can create demagnetizing magnetic fields. The demagnetizing fields may be used to demagnetize flux concentrators 38 and thereby remove undesired offsets from compass 14.

The coils (which may sometimes be referred to as loops, inductors, or inductive elements) may have loop-shaped signal paths formed from metal wire, metal traces on one or more layers of a printed circuit board or other substrate, structures in a package (e.g., a surface mount technology package or other suitable electrical component package), coils in a packaged inductor, or other suitable structures that can produce a magnetic field in response to application of a current. The signal lines in a demagnetizing coil of this type may have a plurality of turns (such as two or more turns or one hundred or more turns, or any other suitable number of turns).

Figure 6:
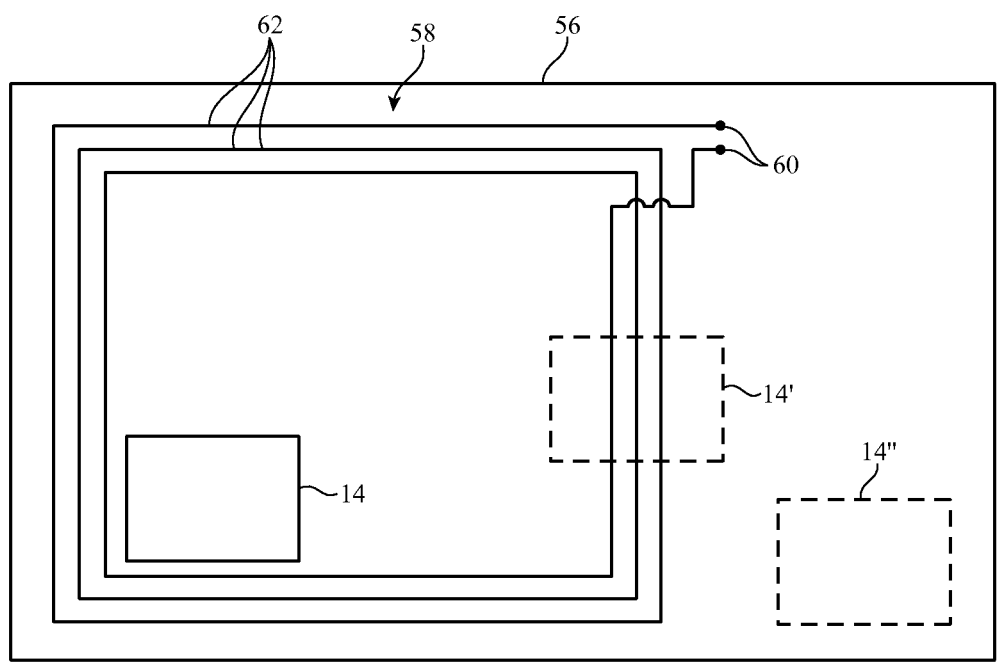
FIG. 6 is a top view of an illustrative configuration for demagnetizing an electronic compass in accordance with an embodiment.

In the illustrative configuration of FIG. 6, compass 14 (e.g., a packaged three-axis magnetic sensor having X, Y, and Z sensors 18 or other suitable magnetic sensor) may be mounted on substrate 56. Coil 58 may have signal paths 62 that are organized in a series of concentric loops. The outline of the loops may be circular, elliptical, rectangular, or square, may have straight segments, curved segments, and/or combinations of straight and curved segments, or other suitable shapes. The cross-sectional shapes of paths 62 may be rectangular, circular, etc.

Current may be applied to terminals 60 by control circuitry 16 to generate a demagnetizing magnetic field that demagnetizes compass 14. Compass 14 may be mounted within the interior of coil 58 so that all of compass 14 overlaps coil 58, in a position that overlaps signal paths 62 of coil 58 (see, e.g., position 14' in which part of compass 14 lies within coil 58 and part of compass 14 lies outside of coil 58), or in a position that does not overlap coil 58 but which is still sufficiently close to coil 58 to receive magnetic fields from coil 58 (see, e.g., position 14" in which compass 14 is mounted outside of the loops of coil 58).

Coil 58 may be formed from metal traces that are formed on substrate 56. For example, substrate 56 may be a printed circuit (e.g., a rigid printed circuit board formed from layers of printed circuit board material such as fiberglass-filled epoxy or a flexible printed circuit formed from a single-layer or multi-layer flexible polymer sheet such as a flexible polyimide layer) and coils 58 may be formed from one or more loops of metal traces in the printed circuit.

Figure 7:
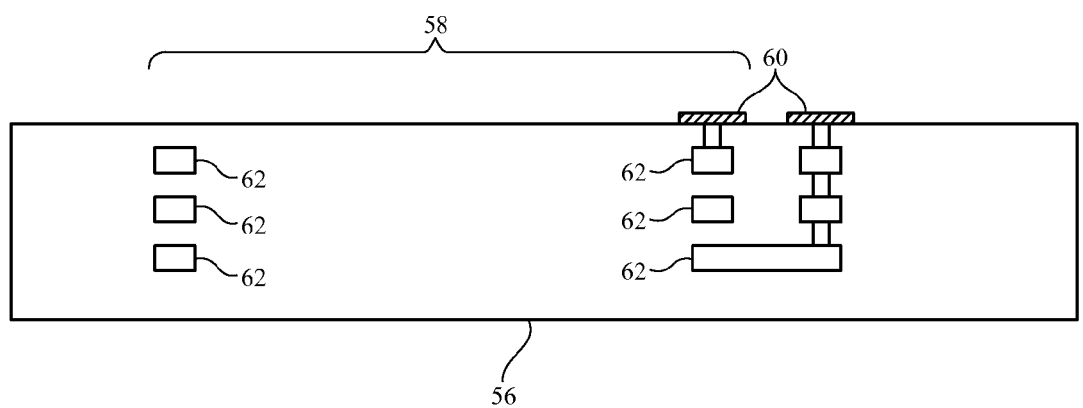
FIG. 7 is a cross-sectional side view of an illustrative inductor formed from coils of traces in a printed circuit board in accordance with an embodiment.
Figure 8:
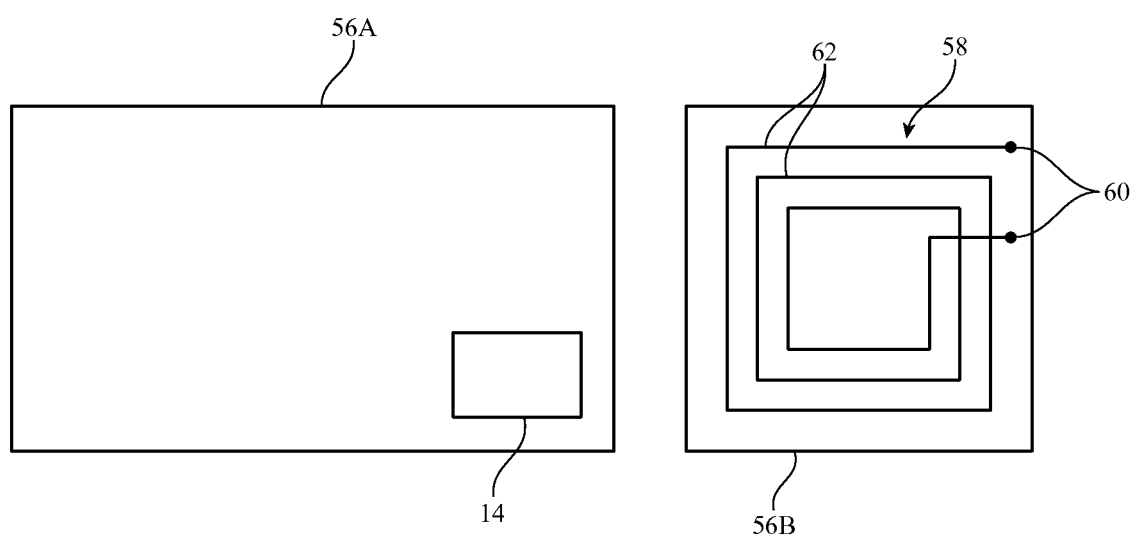
FIG. 8 is a top view of an illustrative inductor and electronic compass that have been mounted on adjacent printed circuits in accordance with an embodiment.
Figure 9:
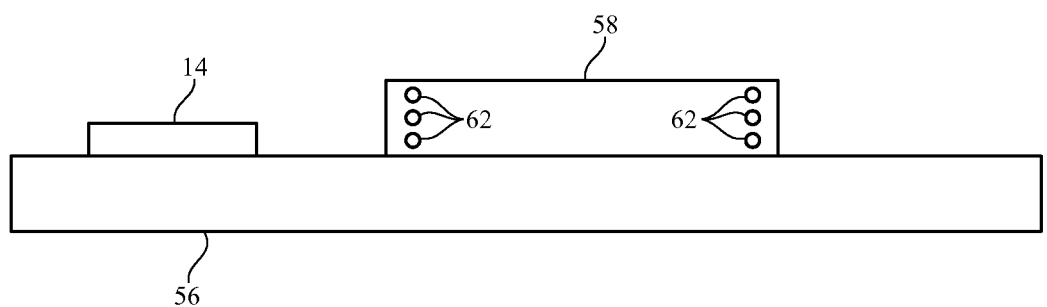
FIG. 9 is a cross-sectional side view of an illustrative electronic compass and associated demagnetizing inductor coil mounted on a common printed circuit in accordance with an embodiment.

A cross-sectional side view of an illustrative printed circuit substrate that contains multiple interconnected loops of metal traces 62 for forming coil 58 is shown in FIG. 7. There are three loops of signal paths 62 in the respective layers of printed circuit 56 in the example of FIG. 7. This is merely illustrative. There may be fewer layers of metal traces, there may be more layers of metal traces, there may be two or more concentric loops of traces in each layer, or other configurations may be used for forming coil 58. In the example of FIG. 8, coil 58 and compass 20 have been mounted on separate printed circuits in device 10. Compass 14 has been mounted on printed circuit board 56A. Coil 58 has been mounted on printed circuit board 56B. If desired, coil 58 may be a packaged inductor having loops of wire or other conductive paths 62 (see, e.g., the cross-sectional side view of FIG. 9 in which compass 14 and packaged inductor 58 have been mounted on printed circuit 56).

Figure 10A:
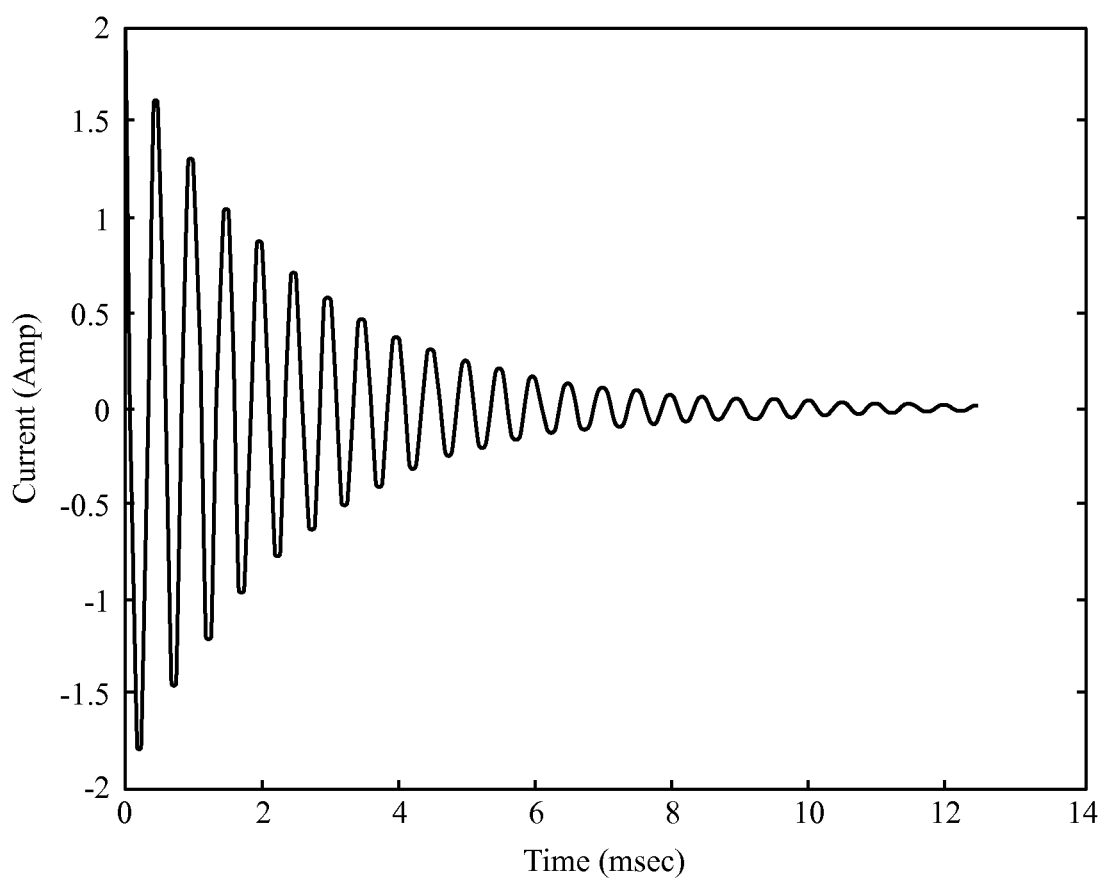
FIG. 10A is a graph of an illustrative demagnetizing drive signal for use in demagnetizing an electronic compass in accordance with an embodiment.
Figure 10B:
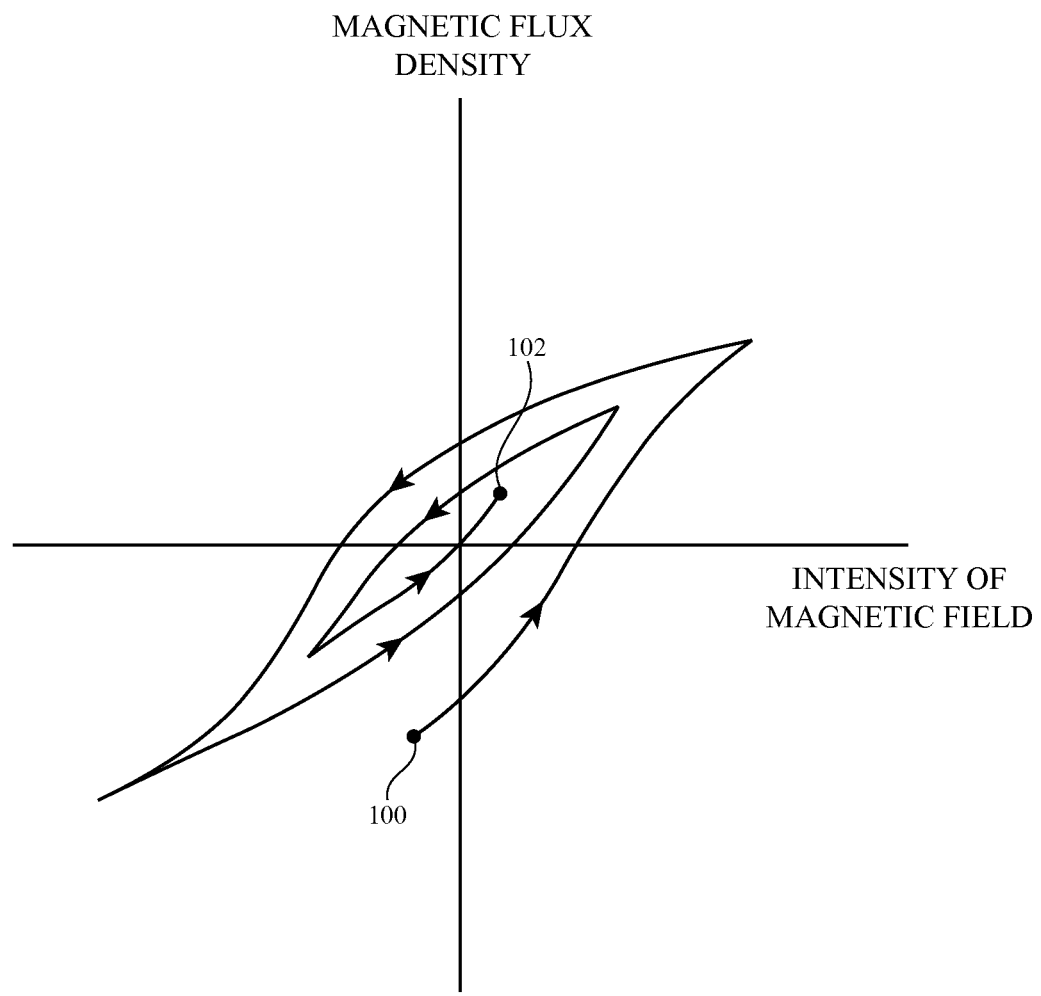
FIG. 10B is a graph illustrating how residual magnetization may be reduce by applying a time-varying degaussing magnetic field in accordance with an embodiment.
Figure 10C:
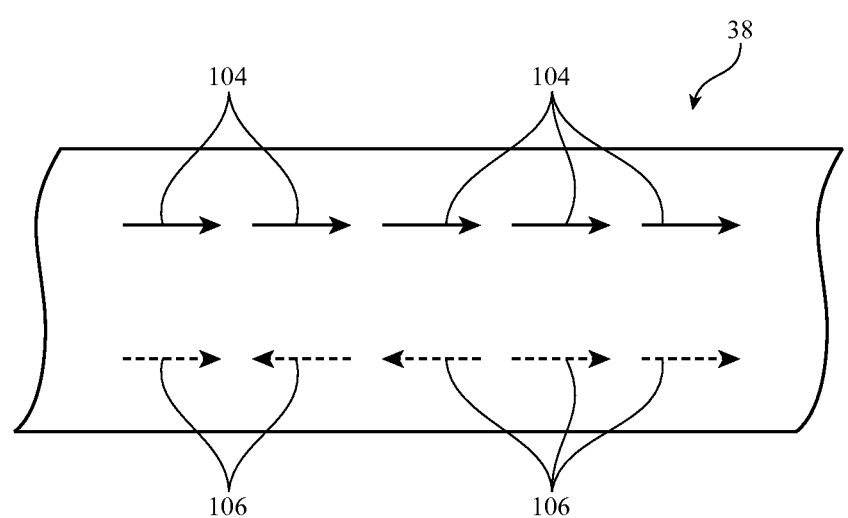
FIG. 10C is a cross-sectional side view of a portion of a flux concentrator showing how demagnetization operations may reduce magnetic domain ordering in accordance with an embodiment.

To demagnetize compass 14, a demagnetizing drive current may be applied to coil 58. The demagnetizing drive current may be, for example, an alternating current (AC) waveform with an exponentially decreasing envelope such as the illustrative signal of FIG. 10A. The frequency of the AC waveform may be about 2000 Hz (or more than 1000 Hz, less than 3000 Hz, less than 10,000 Hz, less than 1000 Hz, 500-1000 Hz, more than 200 Hz, less than 700 Hz, etc.) and may have a duration of 10-15 ms, less than 50 ms, more than 5 ms, or any other suitable duration. The demagnetizing current that is applied to coil 58 generates an AC magnetic field that scrambles the magnetic domains within flux concentrator 38 and thereby reduces undesired offset. As shown in FIG. 10B, for example, as applied magnetic field intensity is cycled back and forth during demagnetization operations, the amount of remnant magnetic flux from the magnetic domains within flux concentrator 38 decreases. Initially, concentrator 38 might be characterized by a relatively large magnetic flux density (see, e.g., point 100 of FIG. 16). Following application of the demagnetizing current to coil 58, the amount of magnetic flux density in flux concentrator 38 may decrease (see, e.g., point 102 of FIG. 16). As shown in FIG. 10C, flux concentrator 38 may initially have domains 104 that are relatively ordered and, following demagnetization, may have less regularly ordered domains 106.

Figure 11:
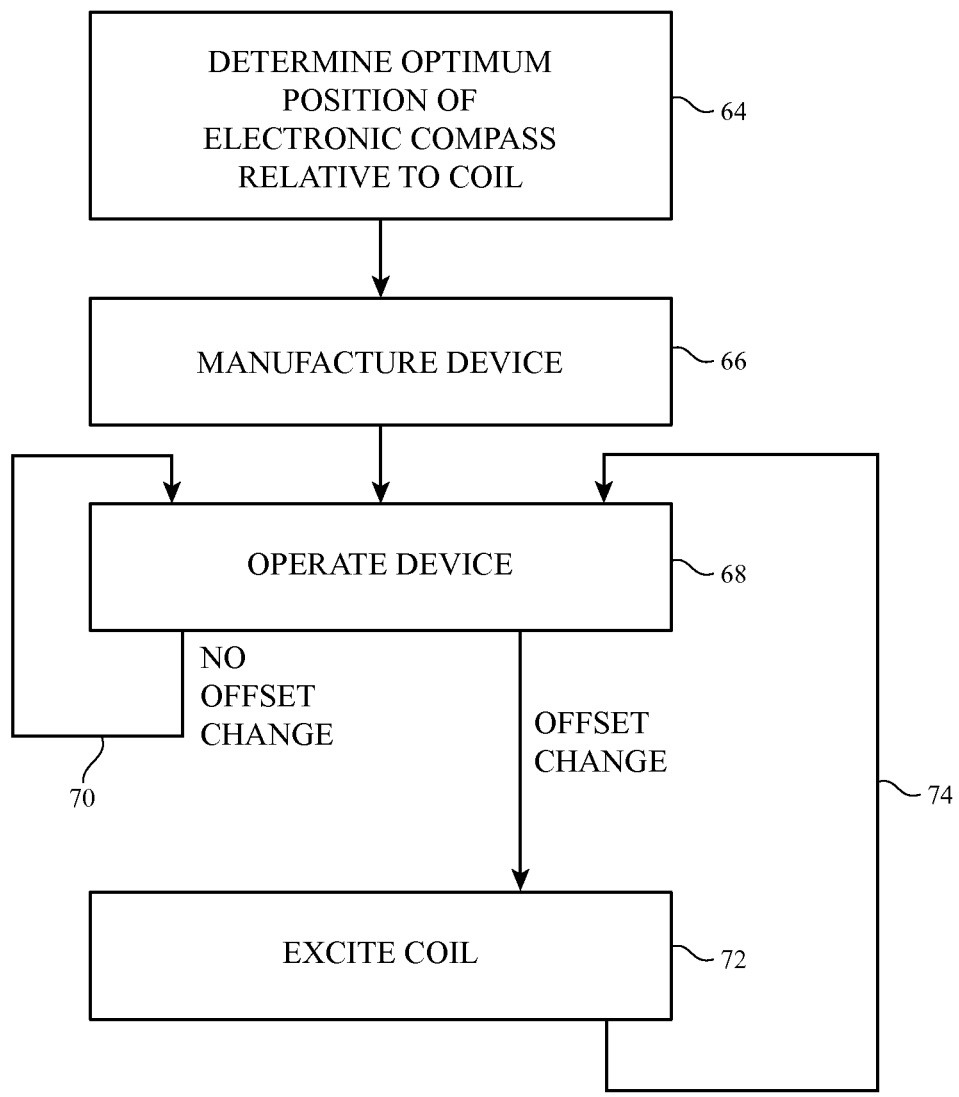
FIG. 11 is a flow chart of illustrative steps involved in demagnetizing an electronic compass in accordance with an embodiment.
Figure 12:
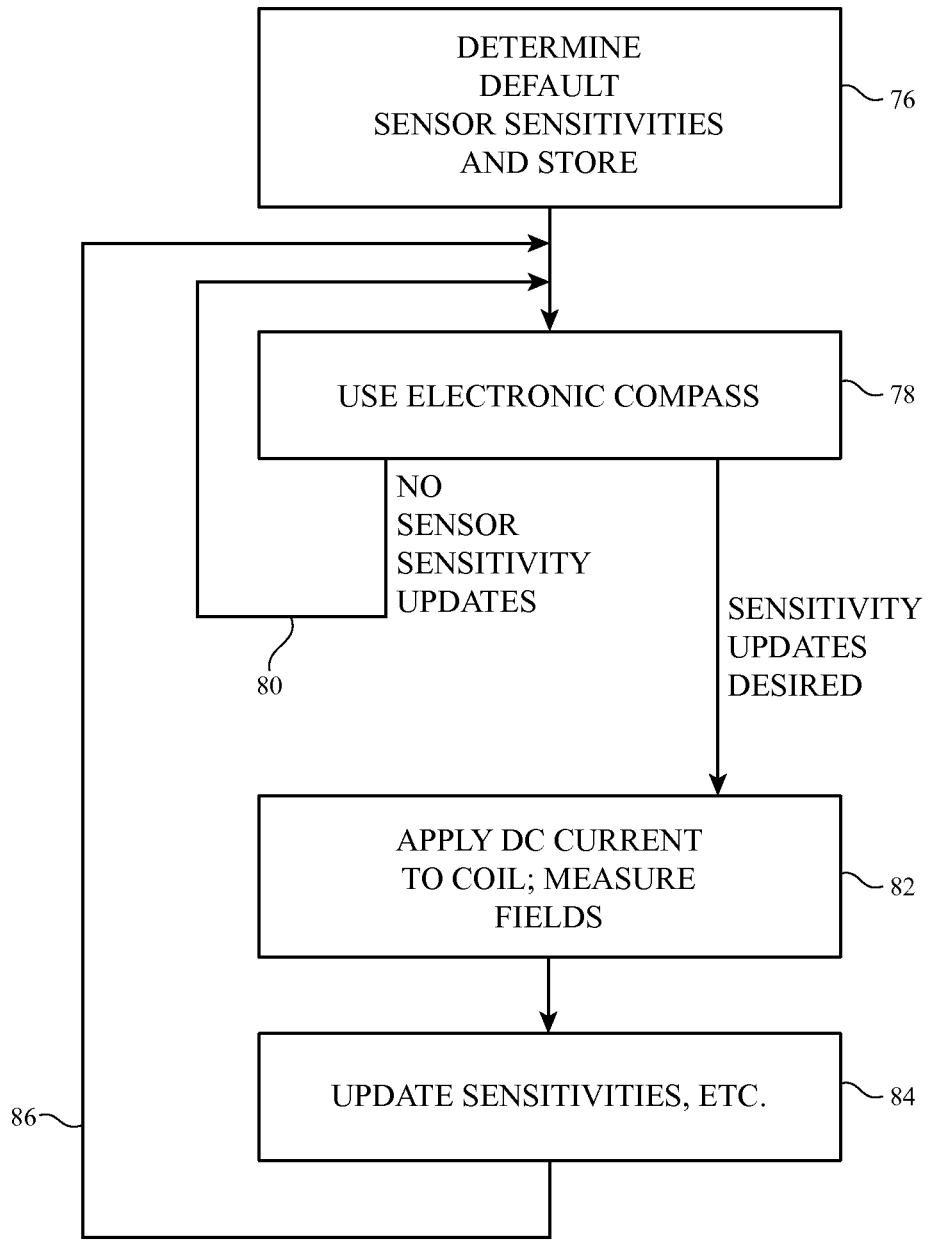
FIG. 12 is a flow chart of illustrative steps involved in measuring sensor sensitivities in an electronic compass in accordance with an embodiment.

Illustrative steps involved in using coil 58 to remove offset from compass 14 are shown in FIG. 11. At step 64 (e.g., during design, testing, and manufacturing operations), an optimum position for coil 58 relative to compass 14 may be determined. This placement preferably helps remove offset from all axes of interest (e.g., X, Y, and Z for compass 14 of FIG. 1) during demagnetization. At step 66, device 10 is manufactured, including compass 14 and at least one appropriately located coil 58.

At step 68, a user of device 10 may operate device 10 normally. During operation, device 10 may sometimes not be exposed to significant external magnetic fields, so no change will take place in the offset of sensors 18 of compass 14. As shown by line 70, the user may continue to use device 10 normally in this situation. If, however, a significant offset is induced in one or more of the sensors 18 of compass 14 by exposure to a large external magnetic field, control circuitry 16 may apply a demagnetizing signal such as the signal of FIG. 10 to coil 58 to demagnetize compass 14 (step 72). The operations of step 72 may be performed periodically, may be performed whenever compass 14 detects a magnetic field more than a predetermined threshold, may be performed in response to user input, or may be performed when other suitable criteria have been satisfied, after which device 10 can be operated normally (step 68), as indicated by line 74.

It may be desirable to monitor the sensitivities of each of sensors 18. Initially (e.g., during calibration as part of a manufacturing operation or at any other suitable time), the sensitivities of sensors 18 may be determined (step 76). Sensor sensitivity may be known from previous device characterization operations and/or coil 58 may produce a known magnetic field in response to application of a known direct current (DC) signal to coil 58. The known magnetic field may be measured by each of sensors 18 and these measurements used to ascertain the sensitivity of each of sensor 18. The initial sensor sensitivity levels for sensors 18 may be stored in device 10.

A user of device 10 may use electronic compass 14 to gather measurements of the Earth's magnetic field or other magnetic fields at step 78. The sensitivities of sensors 18 may be measured periodically, in response to the occurrence of one or more triggering events (e.g., measurement of a large magnetic field), in response to user input, or in response to the satisfaction of other suitable criteria. If no sensor updates are needed, processing may continue at step 78, as indicated by line 80. When sensor sensitivity updates are desired, control circuitry 16 may apply a small known DC current to coil 58 at step 82. In response to the applied current, coil 58 may generate a known amount of magnetic field. The strength of the known magnetic field may be measured by sensors 18. The known magnetic field strength and the known sensor readings may be processed to determine the sensitivity of each sensor 18 at step 84. These sensitivity levels may be stored in memory in device 10 and used to calibrate future magnetic field measurements with compass 14. Following step 84, processing may loop back to step 78 (i.e., device 10 may be used normally), as shown by line 86.

If desired, the stability of the magnetic domain pattern in flux concentrators 38 may be enhanced by using a loop-shaped (annular) flux concentrator configuration. Non-annular magnetic flux concentrators may be characterized by disorderly magnetic domain patterns after being exposed to large external magnetic fields. Ring-shaped flux concentrators, however, are characterized by stable magnetic domain patterns (e.g., all magnetic domains may be oriented in a loop that runs around the flux concentrator ring or in other well-ordered patterns). A ring-shaped flux concentrator will therefore be unlikely to acquire a magnetic domain pattern that produces an unexpected and undesired magnetic sensor offset in compass 14.

Figure 13:
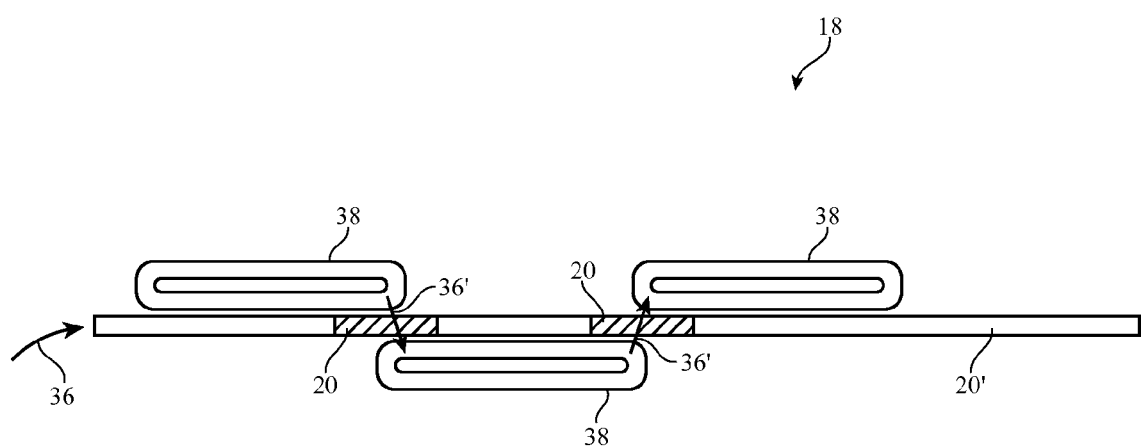
FIG. 13 is a top view of an illustrative X-axis or Y-axis magnetic sensor having annular magnetic flux concentrators in accordance with an embodiment.

FIG. 13 is a top view of an illustrative X-axis or Y-axis magnetic sensor for compass 14. In the example of FIG. 13, sensor 18 has a series of elongated ring-shaped magnetic flux concentrators 38 that are located on alternating sides of an elongated strip of thin-film magnetoresistance sensor material (thin-film magnetoresistance sensor strip 20'). Active areas 20 of strip 20' form magnetoresistance sensor elements that measurably change resistance in response to directed magnetic fields 36' when an external magnetic field (field 36) is present. There are three ring-shaped flux concentrators 38 in the example of FIG. 13 (i.e., two concentrators that are located along one edge of strip 20' and one that is located along the opposing edge of strip 20'). This is merely illustrative. There may be two or more flux concentrators 38, three or more flux concentrators 38, four or more flux concentrators 38, five or more flux concentrators 38, etc.

Figure 14:
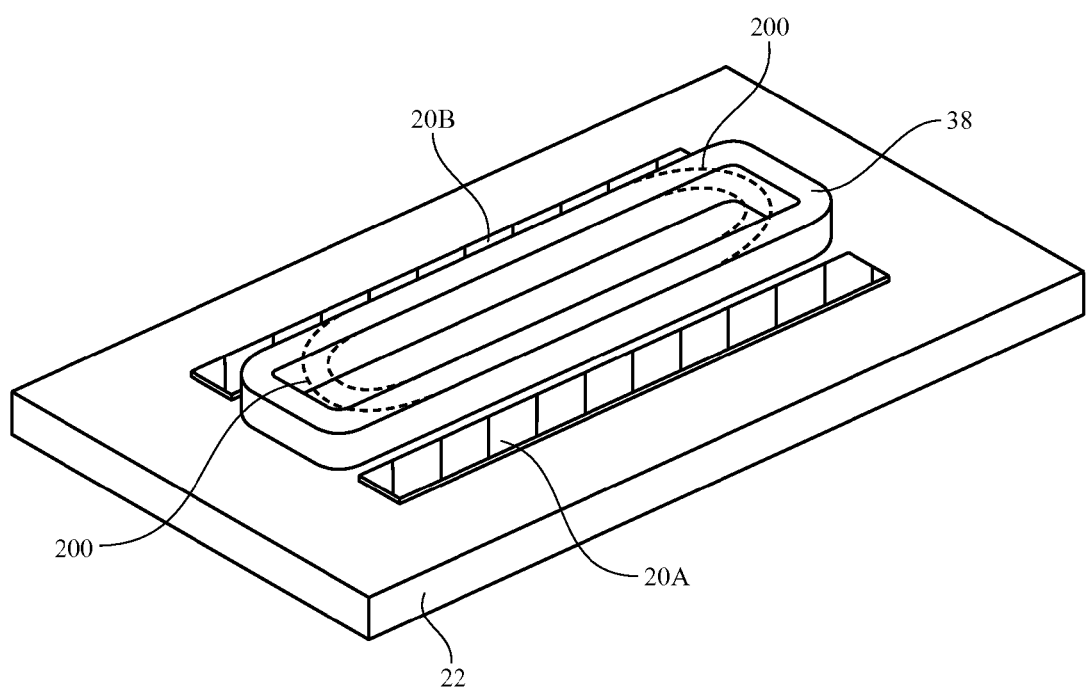
FIG. 14 is a perspective view of an illustrative Z-axis magnetic sensor with an annular flux concentrator in accordance with an embodiment.

FIG. 14 is a perspective view of an illustrative Z-axis magnetic sensor for compass 14. In the illustrative configuration of FIG. 14, sensor 18 has positive elongated magnetic sensor element 20A and negative elongated magnetic sensor element 20B extending along opposing sides of ring-shaped magnetic flux concentrator 38 in parallel with the longitudinal axis of ring-shaped magnetic flux concentrator 38. Flux concentrators 38 of FIGS. 13 and 14 may be 10-100 microns long (or more than 20 microns long or less than 200 microns long) and 1-15 microns high and wide (or more than 1 micron or less than 20 microns). The width of the ring-shaped structure in concentrators 38 may be 1 micron, 0.5-2 microns, more than 0.8 microns, less than 1.5 microns, or other suitable size. The gap in the middle of the ring may be about 3 microns wide, 1-5 microns wide, more than 2 microns wide, or less than 5 microns wide (as examples). Magnetic flux concentrator 38 may have a ring shape such as the shape of a rectangular ring (e.g., a rectangular shape with slightly rounded corners as shown in FIG. 14), an elliptical ring (see, e.g., curved ends 200 in FIG. 14), ring shapes with ends and/or side segments of other curved and/or straight shapes, or other ring shapes.

The ring shapes of flux concentrators 38 such as the flux concentrators of FIGS. 13 and 14 cause flux concentrators 38 to form stable closure domains (and avoid domain wall formation) so the magnetic domains in the flux concentrators are oriented around the ring in a stable fashion. Formation of an orderly and stable magnetic domain pattern in flux concentrators 38 can be further enhanced by forming flux concentrators 38 from a stack of thin magnetically coupled magnetic layers. The layers are preferably sufficiently thin to encourage domains to remain oriented within the plane of the flux concentrator ring.

Figure 15:
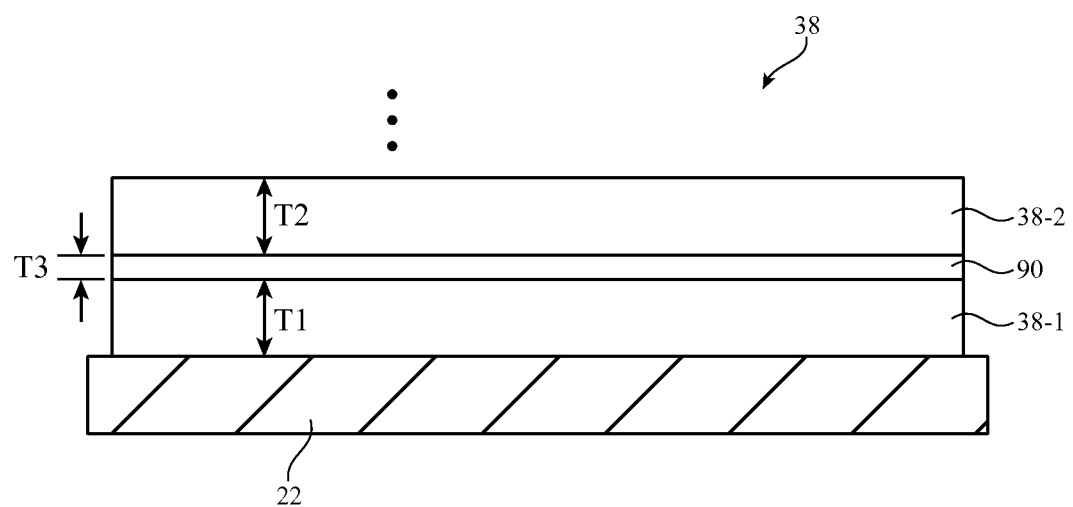
FIG. 15 is a cross-sectional side view of an illustrative flux concentrator having a stack of magnetically coupled magnetic layers in accordance with an embodiment.

A cross-sectional side view of an illustrative flux concentrator with a multilayer configuration of this type is shown in FIG. 15. As shown in FIG. 15, flux concentrator 38 may have a first magnetic layer such as magnetic layer 38-1, a non-magnetic layer such as layer 90, and a second magnetic layer such as magnetic layer 38-2. Additional magnetic layers and non-magnetic layers may be included in the stack of magnetic layers for concentrator 38 if desired (e.g., flux concentrator 38 may have four or more layers of magnetic material).

Magnetic layers 38-1 and 38-2 may be formed from a magnetic material such as NiFe (permalloy), NiCo, CoFe, or other alloys or soft magnetic materials such as Ni, Fe, and Co. Non-magnetic layer 90 may be formed from a layer of aluminum oxide or other non-magnetic material. The thickness T3 of non-magnetic layer 90 may be less than 0.2 microns, less than 0.1 microns, more than 0.01 microns, or other suitable thickness that allows layers 38-1 and 38-2 to magnetically couple. The thicknesses T1 and T2 of magnetic layers 38-1 and 38-2 are preferably less than 1 micron, although larger thicknesses may be used if desired (e.g., thicknesses T1 and T2 may be less than 2 microns, etc.). Thickness T1 may be equal to thickness T2 or may be slightly greater than thickness T2 or other suitable thickness.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
an electronic compass having thin-film magnetoresistance sensors and magnetic flux concentrators;
a demagnetization coil; and
control circuitry that applies current to the demagnetization coil to produce a magnetic field that demagnetizes the magnetic flux concentrators.

2. The electronic device defined in claim 1 wherein the current comprises an alternating current signal and wherein the control circuitry applies the alternating current signal to produce an alternating current magnetic field that demagnetizes the magnetic flux concentrators and thereby reduces offset in the electronic compass.

3. The electronic device defined in claim 2 wherein the control circuitry is configured to apply a direct current signal to the demagnetization coil.

4. The electronic device defined in claim 3 wherein the control circuitry determines magnetic sensor sensitivity levels for the thin-film magnetoresistance sensors by making magnetic field measurements with the electronic compass while the direct current signal is being applied to the demagnetization coil.

5. The electronic device defined in claim 1 wherein the demagnetization coil includes loops of metal traces on a printed circuit.

6. The electronic device defined in claim 5 wherein the electronic compass is mounted on a printed circuit that is separate from the printed circuit that includes the loops of metal traces.

7. The electronic device defined in claim 5 wherein the electronic compass is mounted on the printed circuit.

8. The electronic device defined in claim 7 wherein the loops of metal traces surround the electronic compass.

9. The electronic device defined in claim 7 wherein the electronic compass is located outside of the loops of metal traces.

10. The electronic device defined in claim 7 wherein the electronic compass overlaps the loops of metal traces.

11. The electronic device defined in claim 1 wherein the demagnetization coil comprises multiple layers of metal traces on a printed circuit and wherein each layer of metal traces includes loops of metal traces.

12. The electronic device defined in claim 1 wherein the demagnetization coil comprises a packaged inductor and wherein the electronic compass and the packaged inductor are mounted on a printed circuit board.

13. The electronic compass defined in claim 1 wherein the magnetic flux concentrators include at least one ring-shaped magnetic flux concentrator.

14. The electronic device defined in claim 13 wherein the ring-shaped magnetic flux concentrator includes at least first and second magnetic layers separated by a non-magnetic layer.

15. A magnetic sensor, comprising:
a substrate;
a strip of thin-film magnetoresistance sensor structures extending along an axis on the substrate and having a series of active areas; and
a series of magnetic flux concentrating yokes staggered on alternating sides of the strip of thin-film magnetoresistance sensor structures to direct magnetic flux through the active areas, wherein each yoke is formed from an elongated ring of magnetic material.

16. The magnetic sensor defined in claim 15 wherein the magnetic flux concentrating yokes each include multiple stacked magnetic layers separated by a non-magnetic layer.

17. The magnetic sensor defined in claim 15 wherein the strip of thin-film magnetoresistance sensor structures comprises a strip of thin-film giant magnetoresistance sensor structures.

18. A portable electronic device, comprising:
a printed circuit;
an electronic compass on the printed circuit that has a magnetic sensor and a magnetic flux concentrator that directs magnetic flux through the magnetic sensor; and
a coil of metal traces in the printed circuit through which a signal is passed to reduce leakage flux in the magnetic sensor from remnant magnetization in the magnetic flux concentrator.

19. The portable electronic device defined in claim 18 further comprising control circuitry that passes a direct current signal through the coil to make a magnetic sensor sensitivity level measurement on the magnetic sensor.

20. The portable electronic device defined in claim 18 further comprising a display.

21. Apparatus, comprising:
a substrate;
an elongated ring-shaped magnetic flux concentrating yoke on the substrate;
first and second elongated thin-film magnetoresistance sensors on the substrate extending along opposing sides of the elongated ring-shaped magnetic flux concentrating yoke.

22. The apparatus defined in claim 21 further comprising:
a demagnetizing coil on the substrate.

23. The apparatus defined in claim 22 wherein the elongated ring-shaped magnetic flux concentrating yoke comprises at least first and second magnetic layers separated by a non-magnetic layer.

24. The apparatus defined in claim 23 wherein the first and second magnetic layers each have a thickness of less than 2 microns.

25. A method of operating an electronic device having an electronic compass with magnetic sensors, comprising:
with control circuitry in the electronic device, determining whether magnetic sensor sensitivity updates are desired for the magnetic sensors of the electronic compass; and
in response to determining that magnetic sensor sensitivity updates are desired, using the control circuitry to apply a direct current (DC) current to a coil in the electronic device and making calibrating magnetic sensor measurements with the magnetic sensors while the DC current is being applied.

26. The method defined in claim 25 further comprising:
demagnetizing magnetic flux concentrators in the magnetic sensors by applying a demagnetizing current to the coil.

* * * * *